United States Patent
Ravinuthula et al.

(10) Patent No.: US 12,199,611 B2
(45) Date of Patent: Jan. 14, 2025

(54) OSCILLATOR CIRCUIT WITH OPEN LOOP FREQUENCY MODULATION

(71) Applicant: TEXAS INSTRUMENTS INCORPORATED, Dallas, TX (US)

(72) Inventors: Vishnu Ravinuthula, Dallas, TX (US); Tianyu Chang, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 38 days.

(21) Appl. No.: 18/171,413

(22) Filed: Feb. 20, 2023

(65) Prior Publication Data
US 2024/0283433 A1    Aug. 22, 2024

(51) Int. Cl.
*H03K 3/03*        (2006.01)
*H03K 3/014*       (2006.01)
*H03K 5/135*       (2006.01)

(52) U.S. Cl.
CPC .......... *H03K 3/0315* (2013.01); *H03K 3/014* (2013.01); *H03K 5/135* (2013.01)

(58) Field of Classification Search
CPC ....... H03K 3/0315; H03K 3/014; H03K 3/135
See application file for complete search history.

(56) References Cited

U.S. PATENT DOCUMENTS

| 5,331,295 A * | 7/1994 | Jelinek | H03L 1/00 |
| | | | 331/17 |
| 6,339,349 B1 | 1/2002 | Rajagopalan | |
| 8,378,752 B2 * | 2/2013 | Sako | H03L 7/00 |
| | | | 331/34 |
| 9,444,468 B2 * | 9/2016 | Astrom | H03L 7/18 |
| 2009/0009141 A1 | 1/2009 | Li | |
| 2011/0175683 A1 | 7/2011 | Gibson | |
| 2011/0279153 A1 | 11/2011 | Zhu | |

FOREIGN PATENT DOCUMENTS

WO      2016130255 A1    8/2016

OTHER PUBLICATIONS

International Search Report dated Jun. 20, 2024.

* cited by examiner

*Primary Examiner* — Jeffrey M Shin
(74) *Attorney, Agent, or Firm* — Charles F. Koch; Frank D. Cimino

(57) ABSTRACT

An oscillator circuit includes a ring oscillator and a ramp generator. The ring oscillator includes a first inverter and a second inverter. The first inverter has and a first inverter input, a first inverter output, and a first power terminal. The second inverter has a second inverter input, a second inverter output, and a second power terminal. The second inverter input is coupled to the first inverter output and the second inverter output is coupled to the first inverter input. The ramp generator circuit has a ramp output coupled to the first power terminal and the second power terminal.

18 Claims, 4 Drawing Sheets

OSCILLATOR CIRCUIT WITH OPEN LOOP FREQUENCY MODULATION

BACKGROUND

Many electronic circuits apply multiple power supply voltages. In cases where a power supply voltage is lightly loaded (e.g., a load circuit draws relatively low current), a charge pump circuit may be used to generate the power supply voltage. For example, in a circuit that applies a positive power supply voltage and a negative power supply voltage, a charge pump circuit may be used to generate the negative power supply voltage from the positive power supply voltage when the negative power supply voltage is lightly loaded. Charge pump circuits use switch isolated capacitors to convert an input voltage to an output voltage that may be higher than, or negative relative to, the input voltage. In a charge pump circuit, the switches coupled to a capacitor are operated in sequence to first charge the capacitor from the input voltage and then transfer the charge to the output. A clock signal used to open and close the charge pump switches may be provided by an oscillator circuit.

SUMMARY

Oscillators using open-loop frequency modulation suitable for use with a charge pump circuit are described herein. In one example, an oscillator circuit includes a ring oscillator and a ramp generator. The ring oscillator includes a first inverter and a second inverter. The first inverter has a first inverter input, a first inverter output, and a first power terminal. The second inverter has a second inverter input, a second inverter output, and a second power terminal. The second inverter input is coupled to the first inverter output and the second inverter output is coupled to the first inverter input. The ramp generator circuit has a ramp output coupled to the first power terminal and the second power terminal.

In another example, a circuit includes a charge pump and an oscillator circuit. The charge pump circuit has an oscillator input. The oscillator circuit has an oscillator output coupled to the oscillator input. The oscillator circuit includes a ring oscillator and a ramp generator circuit. The ring oscillator has a power terminal. The ramp generator circuit has a ramp output coupled to the power terminal. The ramp generator circuit is configured to modulate a current provided at the power terminal.

In a further example, a battery system includes a battery cell and a cell monitor circuit. The cell monitor circuit is coupled to the battery cell. The cell monitor circuit is configured to monitor a voltage of the battery cell. The cell monitor circuit includes a charge pump and an oscillator circuit. The charge pump circuit has an oscillator input. The oscillator circuit has an oscillator output coupled to the oscillator input. The oscillator circuit includes a ring oscillator and a ramp generator circuit. The ring oscillator includes an odd number of inverters coupled in series. The ramp generator circuit is coupled to the ring oscillator. The ramp generator circuit is configured to provide a ramp signal used to modulate a current provided to power the inverters.

DETAILED DESCRIPTION

The switching of a charge pump produces charge and discharge currents. These currents produce periodic current peaks on the power supply conductors, and result in undesirable electro-magnetic emissions (electro-magnetic interference (EMI)) at the fundamental and harmonics of the switching frequency. Spread spectrum technology can be used to reduce EMI, and some clock generation circuits use closed-loop phase-locked loop (PLL) architectures to implement spread spectrum clocks. However, PLL clock generators require a reference clock (e.g., a crystal oscillator) that is not available in many applications.

The charge pumps used in some applications (e.g., automotive battery monitoring applications) do not have strict jitter or drift specifications for the clock timing charge pump switching. Because the clock timing specifications in such applications may be relatively lax, complex clock generation circuits, such as PLLs, may not be needed. The oscillator circuit described herein simplifies spread spectrum clock generation by using a ramp generator to control the frequency of a ring oscillator. The ring oscillator may be implemented as a current starved inverter-based voltage-controlled oscillator. The ramp generator modulates the clock provided by the ring oscillator. The oscillator circuit is open-loop and does not use a crystal oscillator or other reference clock. Charge pumps using the oscillator circuit may provide a reduction of emissions of up to 25 dB on the charge pump power supply.

Figure 1:
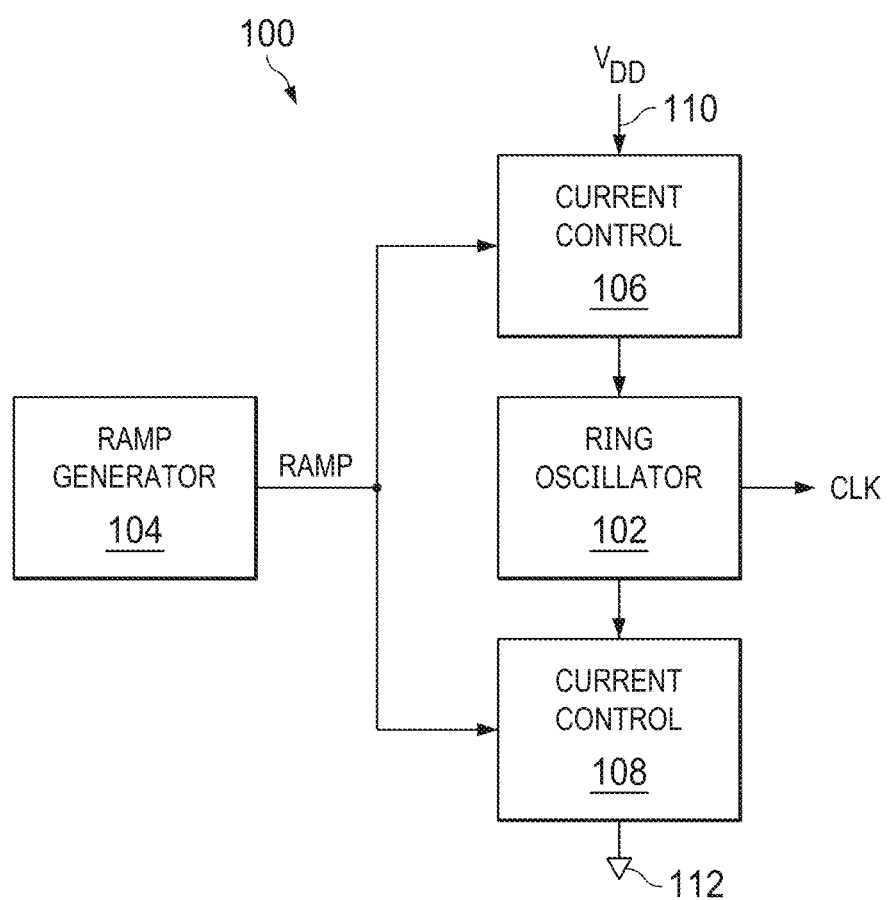
FIG. 1 is a block diagram of an example oscillator circuit with open loop frequency modulation.

FIG. 1 is a block diagram of an example oscillator circuit 100 with open loop frequency modulation. The oscillator circuit 100 includes a ring oscillator 102, a ramp generator circuit 104, a current control circuit 106, and a current control circuit 108. The ring oscillator 102 provides a clock signal (CLK). The ring oscillator 102 includes multiple inverters connected to form a "ring." The output of each inverter is connected to the input of a succeeding inverter, and the output of a last inverter in the chain is connected to the input of the first inverter in the chain. CLK has a frequency determined by the delay of the inverters.

The current control circuit 106 is coupled between a power supply terminal 110 and a power terminal of the ring oscillator 102. The power terminal of the ring oscillator 102 is coupled to a current output of the current control circuit 106. The current control circuit 106 controls the flow of current from the power supply terminal to the ring oscillator 102. The current control circuit 108 is coupled between a ground terminal 112 and a reference terminal of the ring oscillator 102. The reference terminal of the ring oscillator 102 is coupled to a current input of the current control circuit 108. The current control circuit 108 controls the flow of current from the ring oscillator 102 to ground. By controlling the current flowing through the ring oscillator 102, the current control circuit 106 and the current control circuit 108 control the voltage powering the inverters of the ring oscillator 102, and the delay of the inverters. Increasing the current flowing through the ring oscillator 102 decreases the delay of the inverters, and increases the frequency of CLK. Decreasing the current flowing through the ring oscillator 102 increases the delay of the inverters, and decreases the frequency of CLK. The current control circuit 106 and the current control circuit 108 may include variable resistors (e.g., resistors implemented by field effect transistors (FETs)) to set the current flowing through the ring oscillator 102.

The ramp generator circuit 104 is coupled to the current control circuit 106 and the current control circuit 108. The ramp generator circuit 104 generates a control signal (RAMP) that controls the current control circuit 106, the current control circuit 108, and the current flowing therethrough. RAMP may be a triangular, sinusoidal, or other shaped signal that varies to change the frequency of CLK. The amplitude of RAMP determines the range of current provided to the ring oscillator 102, and the range of current provided to the ring oscillator 102 determines the frequency range of CLK. Accordingly, the frequency range of CLK is determined by the amplitude of RAMP. The period of RAMP determines the rate of change of CLK.

CLK provided by the oscillator circuit 100 may be used to clock a charge pump circuit. The variation in frequency of CLK spreads the noise created by switching in the charge pump circuit across a relatively wide band, thereby reducing the noise power at a given frequency.

Some implementations of the oscillator circuit 100 may include only one of the current control circuit 106 or the current control circuit 108. For example, the power terminal of the ring oscillator 102 may be connected to the power supply terminal 110 rather than coupled to the power supply terminal 110 via the current control circuit 106. Alternatively, the reference terminal of the ring oscillator 102 may be connected to the ground terminal rather than coupled to the ground terminal via the current control circuit 108.

Figure 2:
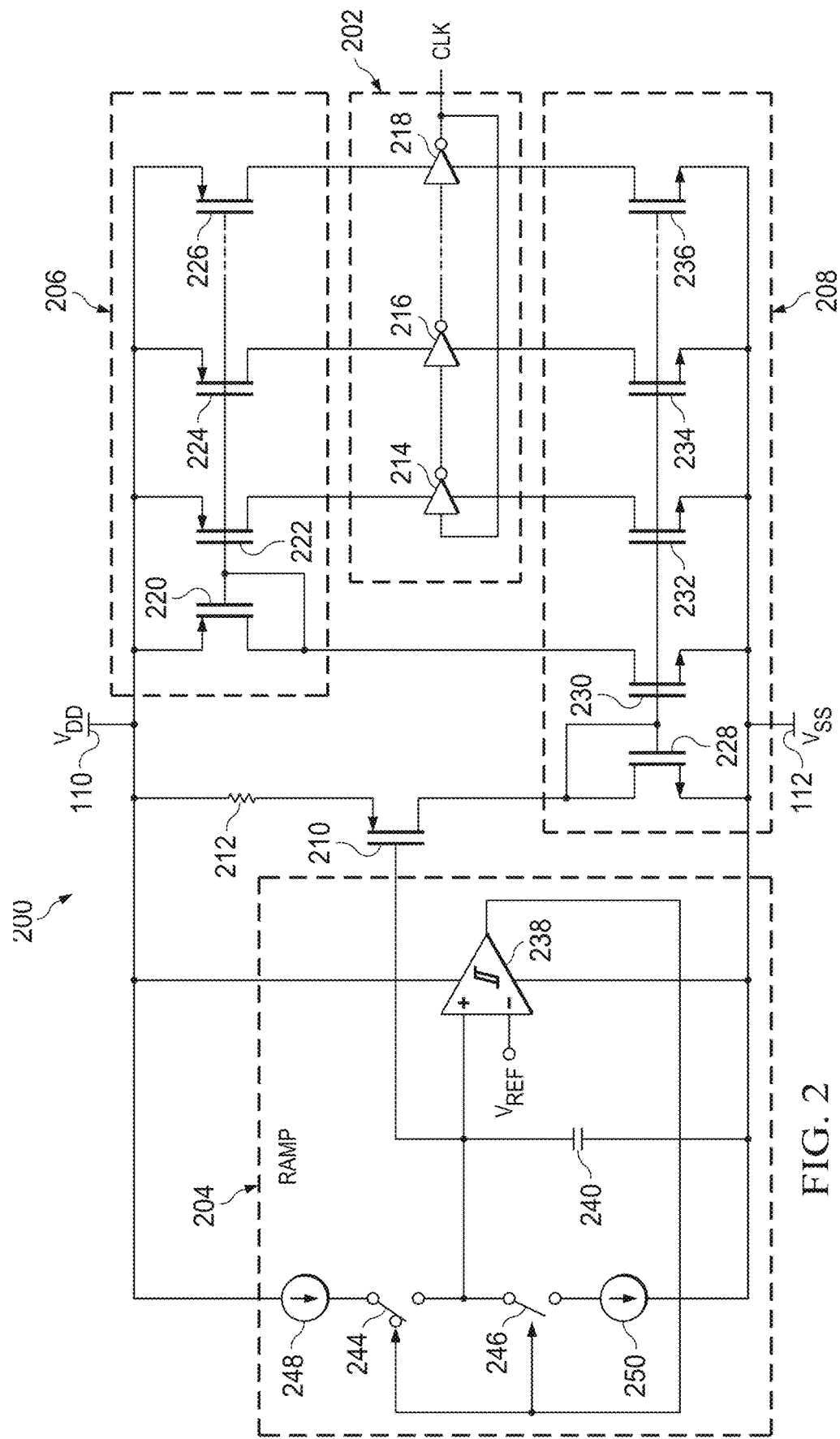
FIG. 2 is a schematic diagram of an example oscillator circuit with open loop frequency modulation.

FIG. 2 is a schematic diagram of an example oscillator circuit 200 with open loop frequency modulation. The oscillator circuit 200 is an implementation of the oscillator circuit 100. The oscillator circuit 200 includes a ring oscillator 202, a ramp generation circuit 204, a current mirror circuit 206, a current mirror circuit 208, a transistor 210, and a resistor 212. The ring oscillator 202 is an implementation of the ring oscillator 102. The ring oscillator 202 includes an odd number of inverters coupled in series to form a ring. While inverters 214, 216, and 218 are illustrated in FIG. 2, the ring oscillator 202 may include more than three inverters. An input (inverter input) of the inverter 214 is coupled to an output (inverter output) of the inverter 218. CLK is provided at the output of the inverter 218. The input of the inverter 216 is coupled to the output of the inverter 214. The input of the inverter 218 is coupled to the output of the inverter 216 through any even number (e.g., 0, 2, 4, 6, etc.) of intervening inverters coupled in series. Each inverter of the ring oscillator 202 includes a power terminal (inverter power terminal) and a reference terminal. The power terminal is coupled to the current mirror circuit 206 and the reference terminal is coupled to the current mirror circuit 208.

The current mirror circuit 206 is an example of the current control circuit 106 and the current mirror circuit 208 is an example of the current control circuit 108. The current mirror circuit 208 includes a control transistor 228 and mirror transistors 230, 232, 234, and 236. The control transistor 228 is diode-connected, and a control terminal (e.g., gate) of each of the mirror transistors 230, 232, 234, and 236 is coupled to a control terminal (e.g., gate) of the control transistor 228. In practice, the current mirror circuit 208 may include a mirror transistor for sinking current flowing from each inverter of the ring oscillator 202. The current flowing in the control transistor 228 is mirrored (e.g., equal to or proportional to the current flowing in the control transistor 228) in each of the mirror transistors 230, 232, 234, and 236. The control transistor 228 and the mirror transistors 230, 232, 234, and 236 may be n-channel field effect transistors (NFETs).

The current mirror circuit 206 includes a control transistor 220 and mirror transistors 222, 224, and 226. The control transistor 220 is diode-connected, and a control terminal (e.g., gate) of each of the mirror transistors 222, 224, and 226 is coupled to a control terminal (e.g., gate) of the control transistor 220. In practice, the current mirror circuit 206 may include a mirror transistor for sourcing current to each inverter of the ring oscillator 202. The current flowing in the control transistor 220 is mirrored (e.g., equal to or proportional to the current flowing in the control transistor 220) in each of the mirror transistors 222, 224, and 226. The current flow though the control transistor 220 is controlled by the mirror transistor 230 of the current mirror circuit 208. The control transistor 220, and the mirror transistors 222, 224, and 226 may be p-channel field effect transistors (PFETs).

The ramp generation circuit 204 is an implementation of the ramp generator circuit 104. The ramp generation circuit 204 includes a comparator 238, a capacitor 240, a switch 244, a switch 246, a current source 248, and a current source 250. An input of the current source 248 is coupled to the power supply terminal 110. A first terminal of the switch 244 is coupled to the output of the current source 248, and a second terminal of the switch 244 is coupled to a top plate of the capacitor 240. A control input of the switch 244 is coupled to the output of the comparator 238 (comparator output). An output of the current source 250 is coupled to the ground terminal. A first terminal of the switch 246 is coupled to the input of the current source 250, and a second terminal of the switch 246 is coupled to the top plate of the capacitor 240. A control input of the switch 246 is coupled to the output of the comparator 238.

A first input of the comparator 238 (comparator input) is coupled to the top plate of the capacitor 240. A second input of the comparator 238 (comparator input) is coupled to a reference voltage circuit (e.g., a band gap circuit). The comparator 238 compares the voltage on the top plate of the capacitor 240 (RAMP) to the reference voltage received from the reference voltage circuit. If the voltage on the top plate of the capacitor 240 is greater than the reference voltage (e.g., greater than the reference voltage by a predetermined hysteresis voltage), the comparator 238 provides an output voltage that opens the switch 244 and closes the switch 246. If the voltage on the top plate of the capacitor 240 is less than reference voltage (e.g., less than the reference voltage by a predetermined hysteresis voltage), the comparator 238 provides an output voltage that closes the switch 244 and opens the switch 246.

When the switch 244 is closed and the switch 246 is open, current flows from the current source 248 to charge the capacitor 240, and voltage on the top plate of the capacitor 240 increases. When the switch 246 is closed and the switch 244 is open, the capacitor 240 is discharged through the current source 250, and the voltage on the top plate of the capacitor 240 decreases. The current sourced by the current source 248 may be the same as the current sunk by the current source 250. Thus, the voltage RAMP may increase and decrease in the form of a triangular ramp signal.

The ramp generation circuit 204 controls current flow through the ring oscillator 202 via the transistor 210. The top plate of the capacitor 240 is coupled to the control terminal (e.g., gate) of the transistor 210. A first current terminal (e.g., source) of the transistor 210 is coupled to the power supply terminal 110 via the resistor 212. A second current terminal (e.g., drain) of the transistor 210 is coupled to the current mirror circuit 208 (the control transistor 228). The transistor 210 may be a PFET. As the voltage of RAMP decreases, the current flowing through the transistor 210 increases. As the voltage of RAMP increases, the current flowing through the transistor 210 decreases. The current flowing through the transistor 210 is mirrored in the currents flowing through the mirror transistors 222, 224, 226, 232, 234, and 236 to vary the current flowing through the ring oscillator 202 and vary the frequency of the ring oscillator 202. The range of RAMP voltage and corresponding range of CLK frequency can vary across implementations of the oscillator circuit 200. For example, in one implementation of the oscillator circuit 200, the RAMP voltage may vary by about +/−6.5% (e.g., 500 millivolts to 570 millivolts), and CLK frequency may change by about +/−12% (e.g., 37 megahertz (MHz) to 47 MHZ).

Figure 3:
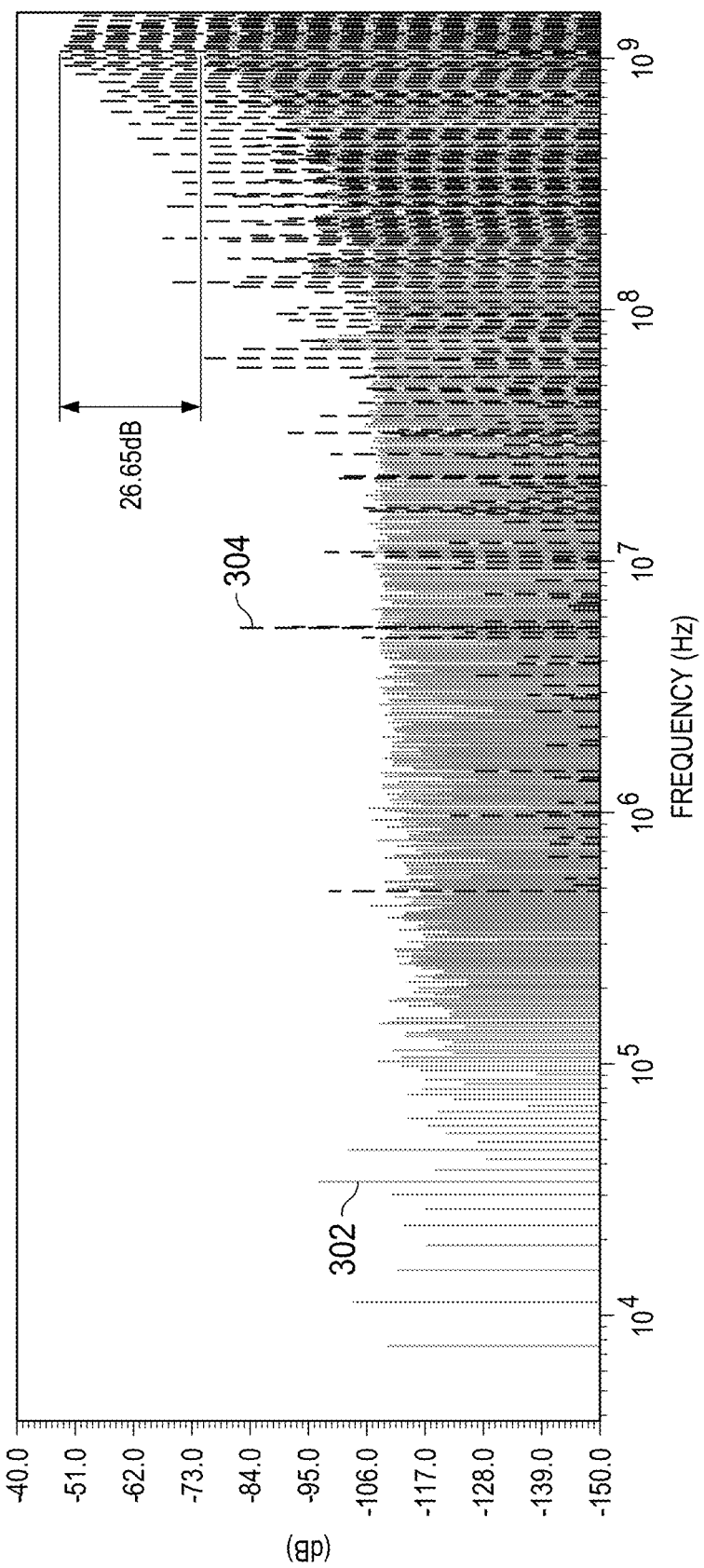
FIG. 3 is a graph of example electro-magnetic emissions of the oscillator circuit of FIG. 1 and a fixed frequency oscillator circuit.

FIG. 3 is a graph of example electro-magnetic emissions of an implementation of a charge pump circuit using the oscillator circuit 100 versus a charge pump circuit using a fixed frequency oscillator circuit. In FIG. 3, the x-axis of the graph represents frequency (Hz) and the y-axis of the graph represents emission magnitude in decibels (dB). The emissions 302 are produced by the charge pump circuit using an implementation of the oscillator circuit 100, and the emissions 304 are produced by the charge pump circuit using a 32-MHz fixed frequency oscillator. The graph shows that the emissions 302 are more than 25 dB lower (e.g., 26.65 dB lower in FIG. 3) than the emissions 304.

Figure 4:
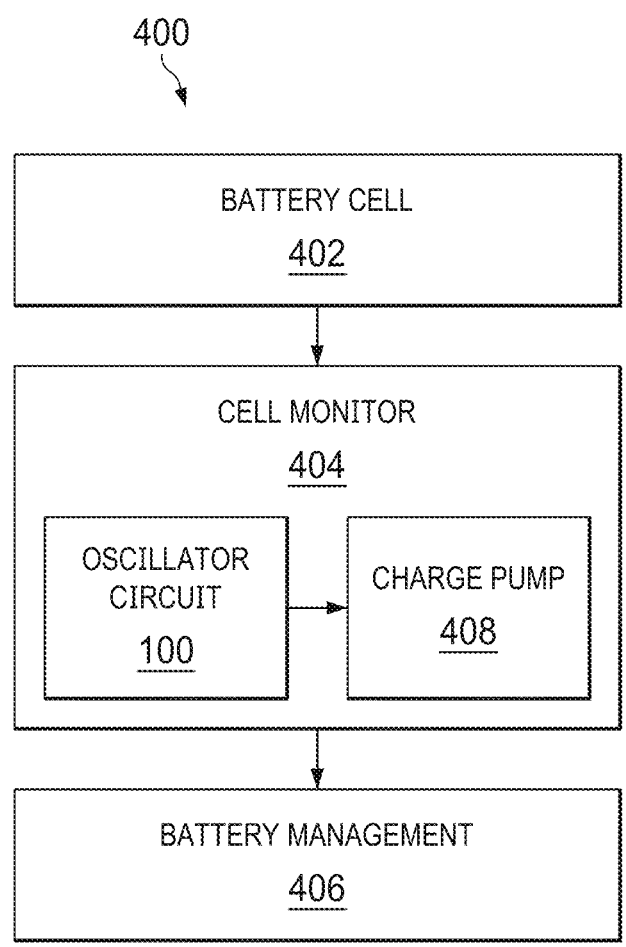
FIG. 4 is a block diagram of an example battery system that includes a charge pump clocked by the oscillator of FIG. 1.

FIG. 4 is a block diagram of an example battery system 400 that includes a charge pump clocked by an implementation of oscillator circuit 100. The battery system 400 includes a battery cell 402, a cell monitor circuit 404, and a battery management circuit 406. The battery cell 402 may be a lithium-ion battery cell, a lithium polymer battery cell, or any other type of battery cell. The cell monitor circuit 404 is coupled to the battery cell 402. The cell monitor circuit 404 can monitor the voltage of the battery cell 402. For example, circuitry of the cell monitor circuit 404 may sample and digitize the voltage of the battery cell 402. In some examples, the cell monitor circuit 404 can be coupled to multiple battery cells and measure the voltages of the multiple battery cells. The cell monitor circuit 404 is coupled to the battery management circuit 406. The cell monitor circuit 404 may provide battery voltage measurements to the battery management circuit 406 for use in management of the battery cell 402. For example, the battery management circuit 406 may adjust the current drawn from the battery cell 402 based on the voltage measurements provide by the cell monitor circuit 404.

The cell monitor circuit 404 includes a charge pump circuit 408 and an oscillator circuit 100 coupled to the charge pump circuit 408. The oscillator circuit 100 provides the clock signal used to operate the charge pump circuit 408. The charge pump circuit 408 may provide a boosted voltage used in the cell monitor circuit 404 to, for example, control switches (e.g., NFETS) that switch the voltage of the battery cell 402 in the cell monitor circuit 404. By using the oscillator circuit 100 to clock the charge pump circuit 408, the cell monitor circuit 404 can substantially reduce the EMI generated by the charge pump circuit 408 without use of complex PLLs and associated crystal oscillators.

The battery system 400 may be used to reduce EMI in an electric vehicle, an electric power tool, or other battery powered system.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An oscillator circuit, comprising:
   a ring oscillator including:
      a first inverter having and a first inverter input, a first inverter output, and a first power terminal; and
      a second inverter having a second inverter input, a second inverter output, and a second power terminal; in which the second inverter input is coupled to the first inverter output and the second inverter output is coupled to the first inverter input; and
   a ramp generator circuit having a ramp output coupled to the first power terminal and the second power terminal, wherein the ramp generator circuit includes:
      a comparator having a first comparator input, a second comparator input, and a comparator output; in which:
         the first comparator input is coupled to the ramp output;
         the second comparator input is coupled to a reference voltage circuit;
      a first switch coupled between a power supply terminal and the first comparator input, and having a first control input coupled to the comparator output; and
      a second switch coupled between a ground terminal and the first comparator input, and having a second control input coupled to the comparator output;
   a first current source coupled between the power supply terminal and the first switch; and
   a second current source coupled between the ground terminal and the second switch.

2. The oscillator circuit of claim 1, wherein the ring oscillator includes a third inverter having a third inverter input, a third inverter output, and a third power terminal; in which:
   the third inverter input is coupled to the first inverter output;
   the third inverter output is coupled to the second inverter input; and
   the third power terminal is coupled to the ramp output.

3. The oscillator circuit of claim 1, further comprising:
   a current mirror circuit including:
   a first transistor including a first control terminal, the first transistor coupled between a power supply terminal and the first power terminal, in which the first control terminal is coupled to the ramp output; and
   a second transistor including a second control terminal, the second transistor coupled between the power supply terminal and the second power terminal, in which the second control terminal is coupled to the ramp output.

4. The oscillator circuit of claim 1, wherein:
   the first inverter includes a first reference terminal;
   the second inverter includes a second reference terminal; and
   the oscillator circuit includes:
      a current mirror circuit including:
         a first transistor including a first control terminal, the first transistor coupled between a ground terminal and the first reference terminal, in which the first control terminal is coupled to the ramp output; and
         a second transistor including a second control terminal, the second transistor coupled between the ground terminal and the second reference terminal, in which the second control terminal is coupled to the ramp output.

5. The oscillator circuit of claim 1, further comprising a capacitor coupled between the ground terminal and the first comparator input.

6. The oscillator circuit of claim 1 further comprising a transistor coupled between the power supply terminal and the ground terminal, the transistor having a control terminal coupled to the first comparator input.

7. A circuit, comprising:
   a charge pump circuit having an oscillator input;
   an oscillator circuit having an oscillator output coupled to the oscillator input, the oscillator circuit including:
      a ring oscillator having a power terminal; and
      a ramp generator circuit having a ramp output coupled to the power terminal, the ramp generator circuit configured to modulate a current provided at the power terminal.

8. The circuit of claim 7, wherein the oscillator circuit includes an odd number of inverters coupled in series, and the inverters include an inverter power terminal coupled to the power terminal.

9. The circuit of claim 7, wherein the oscillator circuit includes:
a current mirror circuit coupled between a power supply terminal and the ring oscillator, the current mirror circuit including:
a control terminal coupled to the ramp output; and
current output coupled to the power terminal,
in which the current mirror circuit is configured to modulate the current provided at the current output based on a ramp signal received at the control terminal.

10. The circuit of claim 7, wherein:
the ring oscillator includes a reference terminal; and
the oscillator circuit includes:
a current mirror circuit coupled between a ground terminal and the ring oscillator, the current mirror circuit including:
a control terminal coupled to the ramp output; and
a current input coupled to the reference terminal;
in which the current mirror circuit is configured to modulate the current received at the current input based on a ramp signal received at the control terminal.

11. The circuit of claim 7, wherein the ramp generator circuit is configured to provide a triangular ramp signal to modulate the current provided at the power terminal.

12. The circuit of claim 7, wherein:
the ramp generator circuit includes:
a comparator having a comparator input and a comparator output; and
a capacitor having a top plate coupled to the comparator input and the comparator output; and
the comparator is configured to control charging and discharging the capacitor to provide a ramp signal at the top plate.

13. The circuit of claim 12, wherein the ramp generator circuit includes:
a current source having a current input and a current output, in which the current input is coupled to a power supply terminal; and
a switch coupled between the current output and the top plate, in which the switch has a control input coupled the comparator output, and the switch is configured to control charging of the capacitor.

14. The circuit of claim 12, wherein the ramp generator circuit includes:
a current source having a current input and a current output, in which the current output is coupled to a ground terminal; and
a switch coupled between the current input and the top plate, in which the switch has a control input coupled the comparator output, and the switch is configured to control discharging of the capacitor.

15. A battery system, comprising:
a battery cell; and
a cell monitor circuit coupled to the battery cell, in which:
the cell monitor circuit is configured to monitor a voltage of the battery cell; and
the cell monitor circuit includes:
a charge pump circuit having an oscillator input; and
an oscillator circuit having an oscillator output coupled to the oscillator input, the oscillator circuit including:
a ring oscillator including an odd number of inverters coupled in series; and
a ramp generator circuit coupled to the ring oscillator, the ramp generator circuit configured to provide a ramp signal used to modulate a current provided to power the inverters.

16. The battery system of claim 15, wherein the oscillator circuit includes:
a current mirror circuit coupled between a power supply terminal and the ring oscillator, the current mirror circuit including a control terminal coupled to the ramp generator circuit and current output coupled to the ring oscillator, in which the current mirror circuit is configured to modulate the current provided to the ring oscillator based on the ramp signal received at the control terminal.

17. The battery system of claim 16, wherein:
the current mirror circuit is a first current mirror circuit; and
the oscillator circuit includes:
a second current mirror circuit coupled between a ground terminal and the ring oscillator, the second current mirror circuit including a control terminal coupled to the ramp generator circuit and current input coupled to the ring oscillator, in which the current mirror circuit is configured to modulate the current received at the current input based on the ramp signal received at the control terminal.

18. The battery system of claim 17, wherein:
the ramp generator circuit includes:
a comparator having a comparator input and a comparator output; and
a capacitor having a top plate coupled to the comparator input and the comparator output; and
the comparator is configured to control charging and discharging the capacitor to provide the ramp signal at the top plate.

* * * * *